(12) United States Patent
Kalms et al.

(10) Patent No.: US 8,094,654 B2
(45) Date of Patent: Jan. 10, 2012

(54) INFORMATION TRANSFER IN ELECTRONIC MODULES

(75) Inventors: Sven Kalms, München (DE); Christian Weiss, München (DE)

(73) Assignee: Qimonda AG, Munich (DE)

( * ) Notice: Subject to any disclaimer, the term of this patent is extended or adjusted under 35 U.S.C. 154(b) by 1505 days.

(21) Appl. No.: 11/528,988

(22) Filed: Sep. 27, 2006

(65) Prior Publication Data

US 2007/0106837 A1    May 10, 2007

(30) Foreign Application Priority Data

Sep. 27, 2005 (DE) .......................... 10 2005 046 134

(51) Int. Cl.
*H04L 12/50* (2006.01)

(52) U.S. Cl. ............ 370/386; 711/1; 711/5; 365/230.01

(58) Field of Classification Search ........................ None
See application file for complete search history.

(56) References Cited

U.S. PATENT DOCUMENTS

| | | | |
|---|---|---|---|
| 6,038,048 A * | 3/2000 | Harris et al. ................... | 398/156 |
| 2004/0199705 A1* | 10/2004 | Phelps et al. ................... | 710/306 |
| 2005/0047250 A1 | 3/2005 | Ruckerbauer et al. | |
| 2005/0081085 A1* | 4/2005 | Ellis et al. .......................... | 714/5 |
| 2005/0098881 A1 | 5/2005 | Perner | |
| 2005/0281096 A1* | 12/2005 | Bhakta et al. ................... | 365/193 |
| 2005/0289317 A1* | 12/2005 | Liou et al. ..................... | 711/170 |
| 2006/0095694 A1* | 5/2006 | Hsieh et al. .................... | 711/157 |
| 2006/0197205 A1* | 9/2006 | Ramakrishna et al. ........ | 257/686 |
| 2006/0200598 A1* | 9/2006 | Janzen .............................. | 710/58 |
| 2011/0029746 A1* | 2/2011 | Lee et al. ....................... | 711/154 |
| 2011/0055509 A1* | 3/2011 | Ware et al. ..................... | 711/167 |

FOREIGN PATENT DOCUMENTS

WO   WO 2005/038813   4/2005

OTHER PUBLICATIONS

German Office Action for German Patent Application No. 10 2005 046 134.4-33 dated Nov. 11, 2010 (7 pages).

* cited by examiner

*Primary Examiner* — Anthony Sol
(74) *Attorney, Agent, or Firm* — Dicke, Billig & Czaja, PLLC

(57) ABSTRACT

An electronic assembly includes electronic modules connected in a series circuit such that a particular number of input connections of one of the electronic modules is connected with the particular number of output connections of another of the electronic modules. Each electronic module is configured to pass on an information which each electronic module receives on an input side at an nth of each electronic module's input connections to an nth of each electronic module's output connections. The input connections and output connections of each electronic module are arranged in a same geometric arrangement. Each electronic module is configured to receive, irrespective of a geometric orientation of the input connections of a given electronic module in relation to a geometric orientation of the output connections of a corresponding electronic module connected with the given electronic module on the input side of the given electronic module, at the same of the given electronic module's input connections, a particular information which is transmitted by the same output connections of the corresponding electronic module.

23 Claims, 6 Drawing Sheets

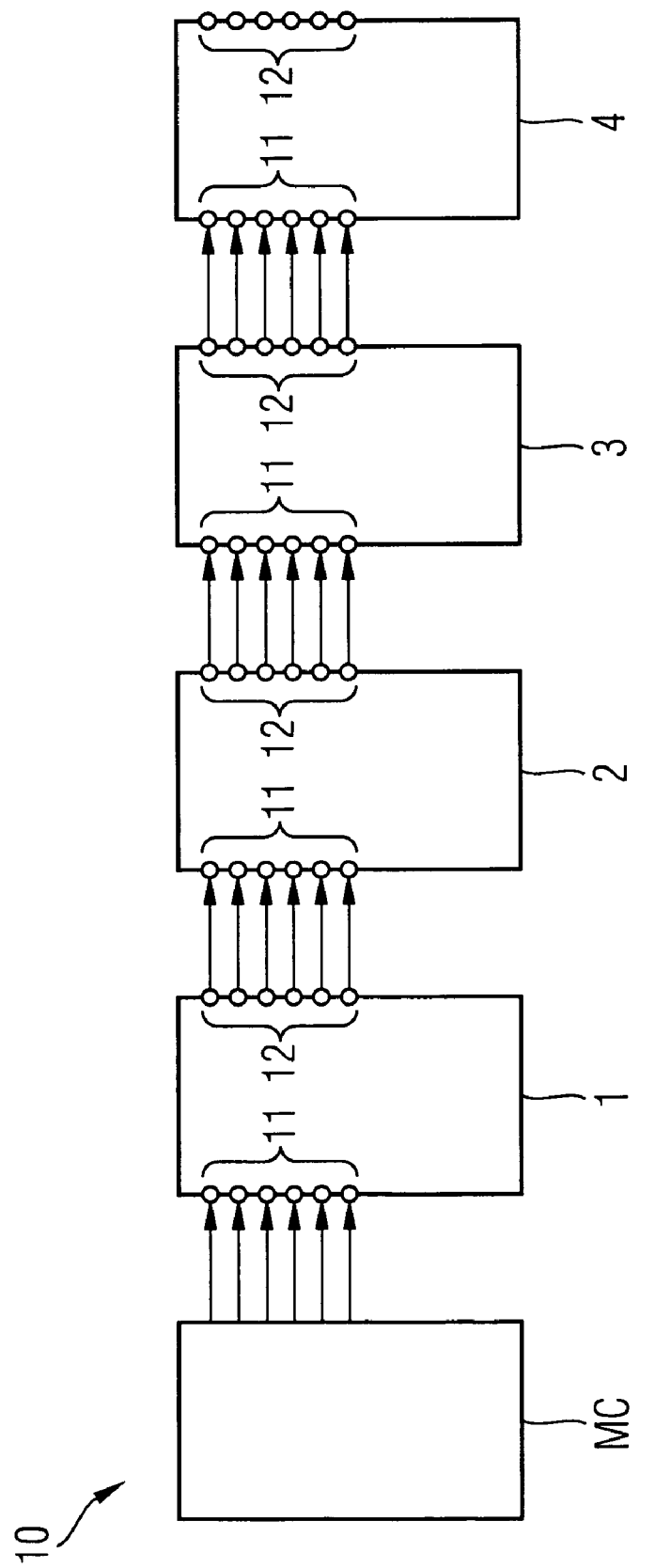

FIG 4A
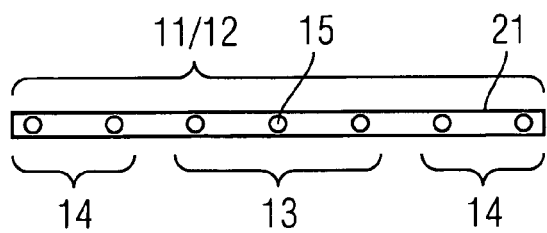
FIG 4B
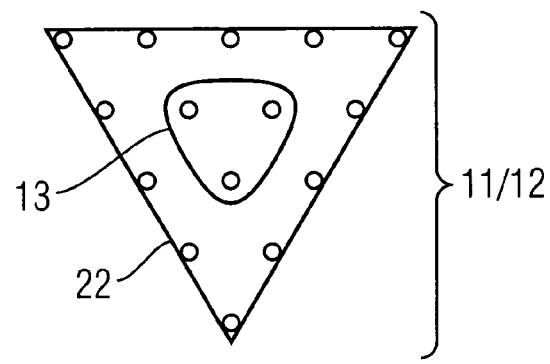
FIG 4C
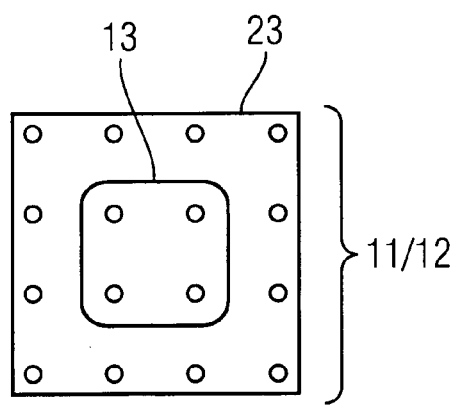
FIG 4D
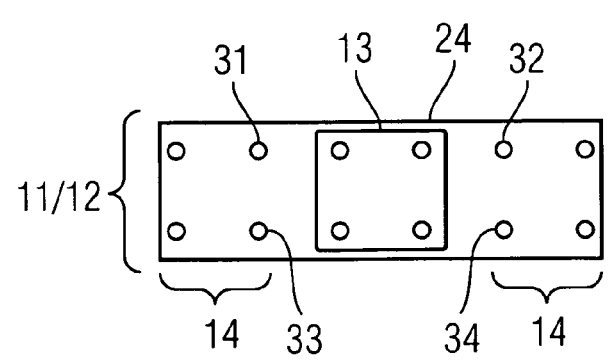
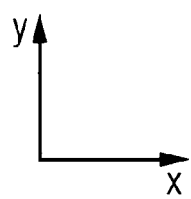

INFORMATION TRANSFER IN ELECTRONIC MODULES

CROSS-REFERENCE TO RELATED APPLICATIONS

This Utility Patent Application claims priority to German Patent Application No. DE 10 2005 046 134.4, filed on Sep. 27, 2005, which is incorporated herein by reference.

BACKGROUND

With particular hardware architectures, (e.g., dynamic random access memory (DRAM) architectures) electronic modules (e.g., parts of ranks) are arranged above each other mainly in order to save space. The output connections of one electronic module are connected with the input connections of a next electronic module. Therefore the electronic modules are designed such that they pass on unchanged information which they receive on the input side at a particular input connection, on the output side at the corresponding output connection (i.e., repeater functionality) so that the electronic module which is connected on the input side with the output connections of the next electronic module receives the same information at its input connections as the next electronic module.

For reasons of package routing, the input connections of an electronic module can be reflected and/or rotated before the input connections are connected with the output connections of a further electronic module with which it is arranged. If the input and output connections of the electronic module are arranged in series, this means that the first input connection of the first module, instead of being connected with the first output connection, is connected with the last output connection of the second module and the second input connection of the first module is connected with the penultimate (i.e., second to last) output connection of the second module etc.

Each conventional electronic module is typically designed to reroute the data received via its input connections if it has previously received information that its input connections receive the data in reverse order. In other words each electronic module typically has additional hardware so that it is able to deal both with the situation where the input connections receive data in the correct order and the situation that the input connections receive data in the reverse order. During an initialization phase, each electronic module is informed whether the one or the other situation is present.

For these and other reasons, there is a need for the present invention.

SUMMARY

One embodiment provides an electronic assembly including electronic modules connected in a series circuit such that a particular number of input connections of one of the electronic modules is connected with the particular number of output connections of another of the electronic modules. Each electronic module is configured to pass on an information which each electronic module receives on an input side at an nth of each electronic module's input connections to an nth of each electronic module's output connections. The input connections and output connections of each electronic module are arranged in a same geometric arrangement. Each electronic module is configured to receive, irrespective of a geometric orientation of the input connections of a given electronic module in relation to a geometric orientation of the output connections of a corresponding electronic module connected with the given electronic module on the input side of the given electronic module, at the same of the given electronic module's input connections, a particular information which is transmitted by the same output connections of the corresponding electronic module.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 1 illustrates diagrammatically a memory system according to one embodiment where per rank only one rank part is illustrated.

FIGS. 4A-4D illustrate different variants of reflection- and rotation-symmetrical geometric arrangements of the connections of a rank part.

DETAILED DESCRIPTION

Figure 2A:
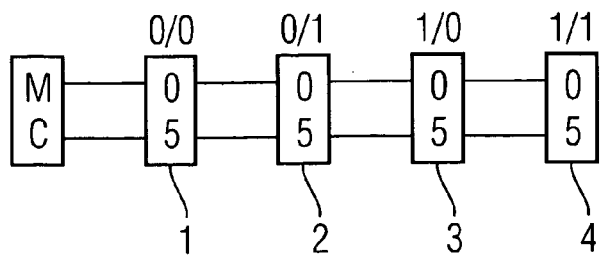
FIGS. 2A-2P illustrate possible arrangement variants of the DRAM memory components depicted in FIG. 1 when the reflection- and rotation-symmetrical arrangement of connections of one rank part has two reflection- or rotation-symmetrical alignments.
Figure 2B:
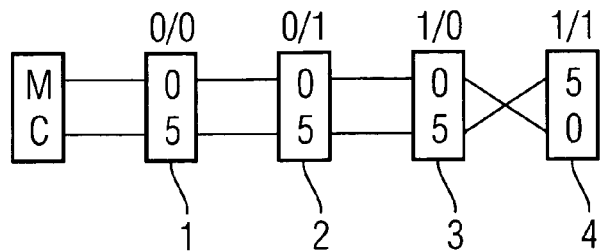
Figure 2C:
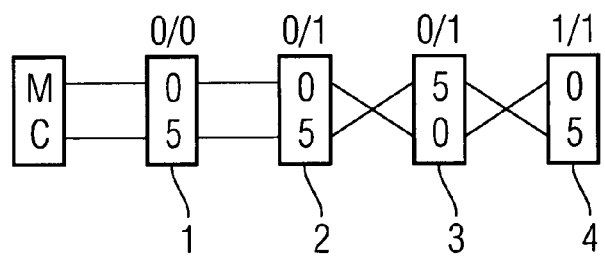

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Embodiments provide a method for the transfer of information in electronic modules, such as parts of a rank of a digital memory, and an assembly, such as a DRAM memory system, which is designed according to this method.

One embodiment of a method provides for transfer of information in electronic modules, wherein the electronic modules are connected in a series circuit such that input connections of one of the electronic modules are connected with output connections of another of the electronic modules. Each electronic module loops information which it receives at its nth input connection unprocessed and unchanged through to its nth output connection so that this information is also available in unchanged form to an electronic module connected therewith on the output side. The input and output connections of each electronic module are arranged in the same geometric arrangement for each electronic module. Irrespective of the geometric orientation of the input connections of one or more of the electronic modules in relation to the geometric orientation of the output connections connected with these input connections of the electronic module connected on the input side with the corresponding electronic module, a particular piece of information is received at the same input connections or transmitted by the same output connections of the electronic module connected on the input side.

In particular, according to an embodiment, irrespective of whether the geometric arrangement of the input connections of one or more of the electronic modules, in relation to the geometric arrangement of the output connections connected with these input connections of the electronic module connected on the input side with the corresponding electronic module, are reflected, rotated, reflected and rotated or neither reflected nor rotated, a particular piece of information is received at the same input connections or transmitted by the same output connections of the electronic module connected on the input side.

In one embodiment, a particular information is always received at the same input connections of an electronic module. Thus, the electronic module according to this embodiment needs no additional hardware even if its input connections are connected reflected and/or rotated with the output connections of the electronic module present on the input side (e.g., the first input connection is connected with the last output connection, the second input connection with the penultimate output connection etc). This also applies even if the input connections of a particular electronic module are connected not reflected or rotated with the corresponding output connections, but the input connections of a preceding electronic module are connected reflected and/or rotated with the output connections connected therewith. In one embodiment no additional hardware is used to re-route the particular information in the module, and advantageously no additional run time via this additional hardware occurs. Therefore, the costs of the additional hardware can be saved, making each module cheaper.

Compared with this embodiment, a conventional procedure adds to each electronic module an additional hardware which leads to higher unit prices. In addition the extra hardware, which usually comprises a multiplexer on the receiver part of the electronic module, leads to longer run times in comparison with an electronic module, according to this embodiment, which does not have this multiplexer. In particular, if the hardware architecture is a memory system comprising a DRAM memory and the electronic modules are parts of a rank of this memory system, the higher unit costs and the longer run time become costly.

The above embodiment can eliminate from the individual module the cost which is conventionally necessary to deal with any reflection and/or rotation of the arrangement of the input connections in relation to the output connections connected therewith within the module. According to this embodiment, processing of any reflection and/or rotation of the arrangement of the input connections is shifted to the control device which controls several modules.

According to another embodiment, the geometric arrangement of the input and output connections of all electronic modules is reflection-symmetrical and/or rotation-symmetrical. In addition, the input and output connections on each electronic module which receive and transmit respectively the particular information can each be arranged in a centre area of this geometric arrangement, wherein the centre area is distinguished in that it is invariable in relation to any reflection-symmetrical and/or rotation-symmetrical alignment of the geometric arrangement of the input and output connections. This means that irrespective of the reflection- and/or rotation-symmetrical alignment in which the input connections are connected with the output connections, the connections arranged in the centre area (input and output connections) are the same or the centre area does not change.

As the connections which carry the particular information are arranged in the centre of a reflection-symmetrical and/or rotation-symmetrical geometric arrangement, a reflection- and/or rotation symmetrical rotation of this reflection- and/or rotation-symmetrical arrangement leads to the same quantity of connections or the same connections carrying the particular information, (i.e., the quantity of connections carrying particular information remains the same).

One embodiment of an electronic assembly, such as a memory system comprising a DRAM memory component, comprises several electronic modules, such as parts of a rank. The electronic modules are connected in the form of a series circuit such that a particular quantity of input connections of one of the electronic modules is connected with a particular quantity of output connections of another of the electronic modules. Each electronic module passes on information which it receives on the input side at a particular input connection, to one of its output connections which plays the same role in the particular quantity of its output connections as the particular input connection in the particular quantity of its input connections. The input and output connections of each electronic module are arranged in the same geometric arrangement. The module is designed such that each electronic module, irrespective of whether the geometric arrangement of the input connections of one or more of the electronic modules, in relation to the geometric arrangement of the output connections connected with the input connections, is reflected, rotated, reflected and rotated or neither reflected nor rotated, receives the particular information at the same quantity of its input connections or transmits the particular information from the same quantity of output connections of the electronic module connected with it on the input side.

The advantages of this assembly embodiment include those described above in the discussion of the above method embodiment.

According to a further embodiment, the above-described method and assembly are employed in memory systems comprising DRAM memory components in which up to four or possibly more parts of a rank of the DRAM are arranged on each other. The invention is not however restricted to this area of application, but can be used wherever correspondingly designed electronic modules arranged above each other are triggered accordingly.

FIG. 1 illustrates diagrammatically one embodiment of a memory system 10 with a memory controller MC and four rank parts 1-4, where each belongs to one of the four ranks. The four rank parts 1-4 are arranged in series so that except for the first rank part 1, the input connections 11 of a rank part 2-4 are connected with the output connections 12 of the rank parts 1-3 arranged on the input side. The input connections 11 of the first rank part 1 are connected with the output connections of the memory controller MC.

In one embodiment, when the memory controller sends an instruction (e.g., a read instruction) to one of the rank parts 1-4, it sends a frame comprising several character elements to the input connections 11 of the first rank part 1 which passes on the transmitted data to the further rank parts 1-3. The data contain information such as (e.g., the row and column address of the datum to be read). As an instruction can concern one of the four rank parts 1-4, the instruction transmitted by the memory controller MC must contain an identification of the corresponding rank part 1-4 so that the instruction is read and executed only by the rank part 1-4 concerned. In the embodiment of the DRAM memory component 10 illustrated in FIG. 1 with four rank parts 1-4, the four rank parts 1-4 are addressed with an address comprising two bits. The address is arranged in each case in the centre of the six input connections 11 and six output connections 12 of the four rank parts 1-4 and hence also in the centre of the six output connections of the memory controller MC.

As the address is transmitted in each case from the centre two connections (the third and fourth of the six connections), the address is then also transmitted from the centre two connections when the geometric arrangement of the input connections of a rank part 1-4 are reflected in relation to the geometric arrangement of the output connections 12 connected therewith. In the embodiment illustrated in FIG. 1, the geometric arrangement of connections 11, 12 is a row so that the geometric arrangement has only two rotation-symmetrical or reflection-symmetrical alignments. In other words, either the first input connection is connected with the first output connection, the second input connection with the second output connection etc. or the first input connection is connected with the sixth output connection, the second input connection with the fifth output connection etc.

If therefore the geometric arrangement of the input connections is arranged reflected in relation to the geometric arrangement of the output connections, the third input connection is connected with the fourth output connection and the fourth input connection with the third output connection. Therefore, as before, the centre input connections carry the address, (i.e., the quantity of connections which carry the address has not changed).

Taking the actual address of the first rank part as 0/0, the address of the second rank part 2 as 0/1, the address of the third rank part as 1/0, and the address of the fourth rank part 4 as 1/1, then the occupation of the third and fourth output connections by the memory controller MC, in order to address the second rank part 2 and the third rank part 3, depends on whether the rank parts 1-3 are arranged so that the third connection of the second rank part 2 or the third rank part 3 is coupled with the third output connection or with the fourth output connection from the memory controller MC. Therefore, in a single initialization phase of the DRAM memory component, the second rank part 2 and third rank part 3 are informed that they should respond to a current address 0/1 and 1/0 or to 1/0 and 0/1, respectively. As the addresses of the first rank part 1 and fourth rank part 4 0/0 and 1/1 are reflection-symmetrical, respectively, their current address in each case corresponds to the actual address.

With regard to the address of the rank parts, all rank parts 1-4 of the same rank generally have the same address, where this address can be a rank address. Since the section above focuses not the rank but the rank part, the rank part address is mentioned where usually it means the address of the rank to which the rank part belongs.

In addition, the allocation of current addresses to the individual rank parts or ranks can take place independently of the actual address of each rank. The memory controller MC for this in an initialization phase allocates an address to each rank part 1-4 which it determines as follows. First, the memory controller determines, for example via a counter, a unique address per rank part 1-4 or rank. Then, it determines how this address would change because of the reflection and rotation of the connections between the rank parts 1-4 on the way from the memory controller MC to the corresponding rank part, and from this determines the current address of each rank part. The memory controller MC evaluates information on how the connections between the rank parts 1-4 are rotated and reflected. The memory controller MC then announces this current address to each rank part 1-4. It is possible that several rank parts 1-4 are allocated the same current address.

With regard to the other connections (i.e., the first, second, fifth and sixth connections), the memory controller MC is informed in the single initialization phase whether or not it needs to change the occupation of the other output connections. In other words, the memory controller MC after the single initialization phase knows whether its first output connection is connected with the first or sixth input connection of any rank part 1-4. Depending on this information, the memory controller MC occupies its first, second, fifth and sixth output connections corresponding to those of rank parts 1-4 which it wishes to address with the corresponding instruction.

Figure 2D:
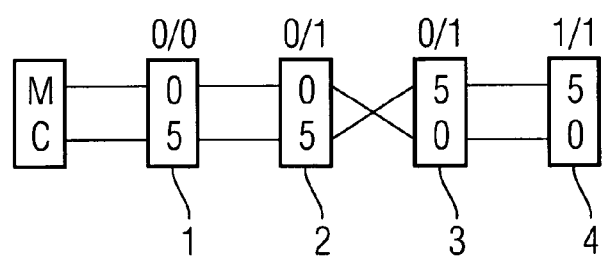
Figure 2E:
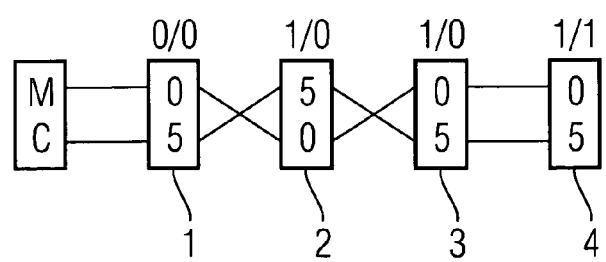
Figure 2F:
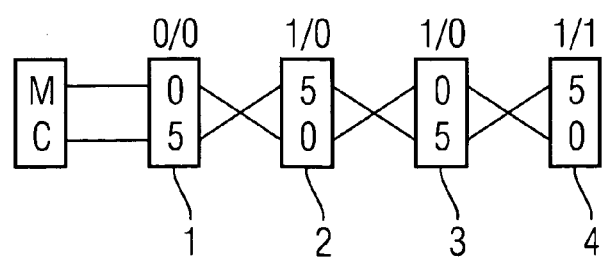
Figure 2G:
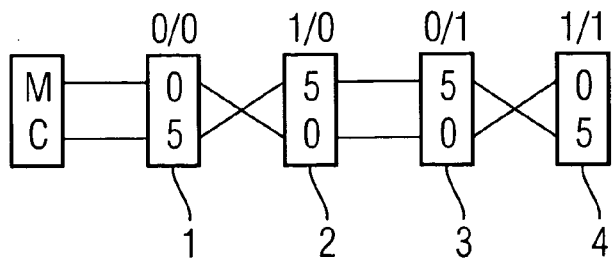
Figure 2H:
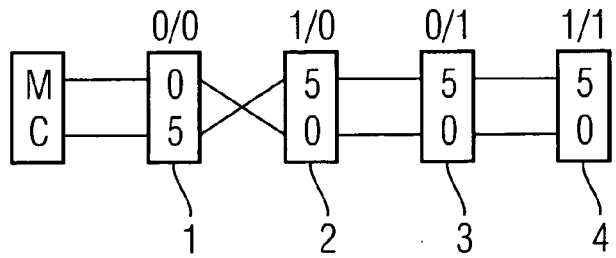
Figure 2I:
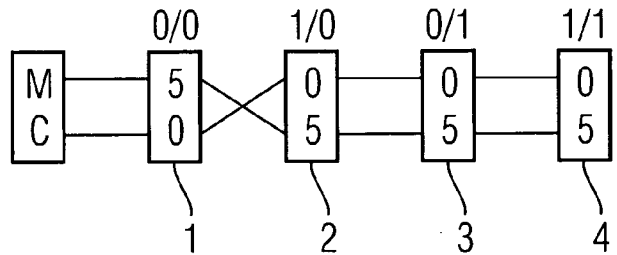
Figure 2J:
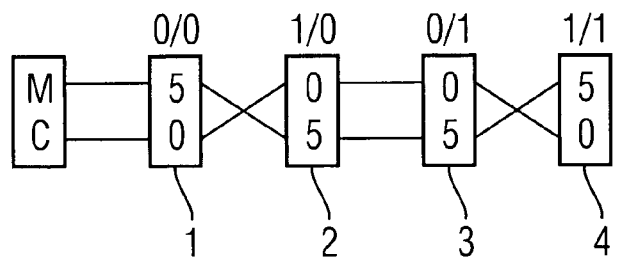
Figure 2K:
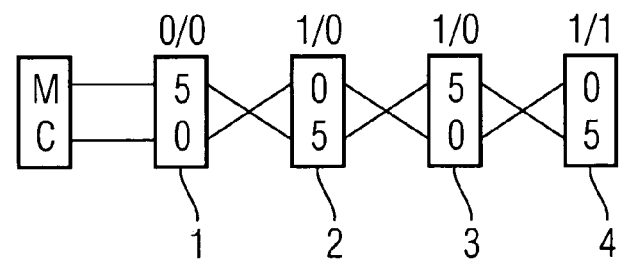
Figure 2L:
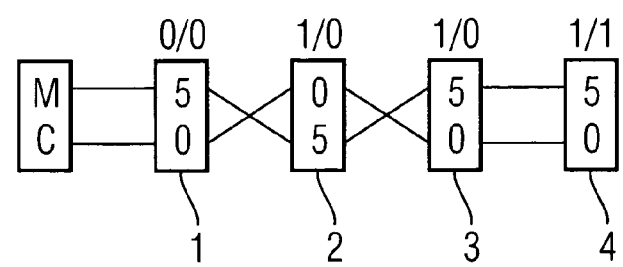
Figure 2M:
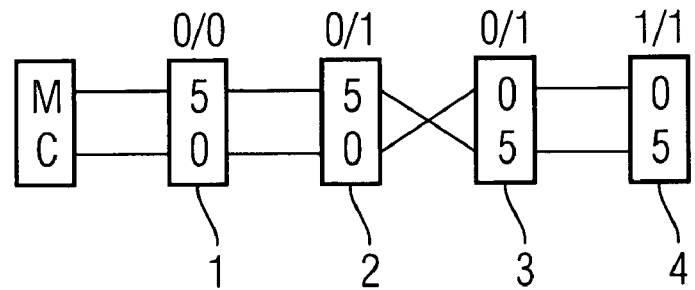
Figure 2N:
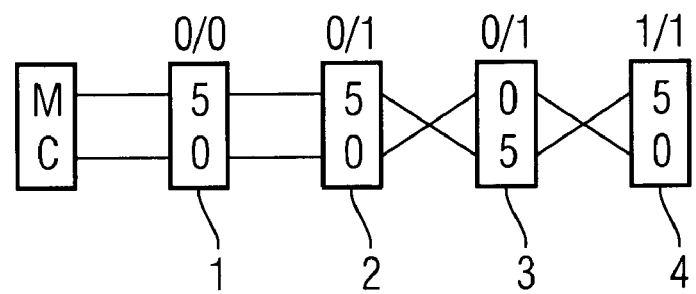
Figure 2O:
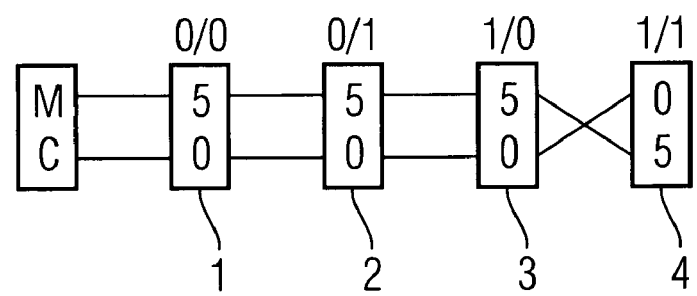
Figure 2P:
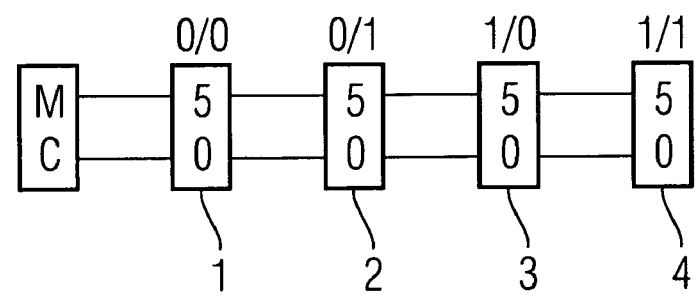

FIGS. 2A-2P illustrate for one embodiment all possible combinations of the reflected or rotated or non-reflected or non-rotated connections between the rank parts 1-4 and/or between the memory controller MC and the first part 1. Above each rank part 1-4 is illustrated the actual address of the corresponding rank part (i.e., the address by which the rank part 1-4 is addressed for the corresponding combination).

With the combination illustrated in FIG. 2D the current address of the second rank part 2 is 0/1 and the current address of the third rank part is also 0/1. In other words, the second rank part in the combination of FIG. 2D responds when on an instruction at its third input connection it receives a 0 and at its fourth input connection a 1. The third rank part 3 reacts the same way if at its third input connection it receives a 0 and at its fourth input connection a 1. This does not cause a problem as the connection between the second rank part 2 and the third rank part 3 is reflected or rotated. In order, for example, to address the third rank part 3, the memory controller MC occupies its third and fourth output connections with the actual address 1/0 of the third rank part (i.e., the third connection with 1 and the fourth connection with 0).

With regard to occupation of its first, second, fifth and sixth output connections the memory controller MC knows that it must occupy these output connections in relation to the first rank part and second rank part 2 normally and in relation to the third rank part 3 and fourth rank part 4 reflected or rotated.

The right-hand side of FIGS. 2I-2P illustrate for one embodiment all possible connections at which the connection between the memory controller MC and the first rank part 1 is reflected or rotated.

Figure 3:
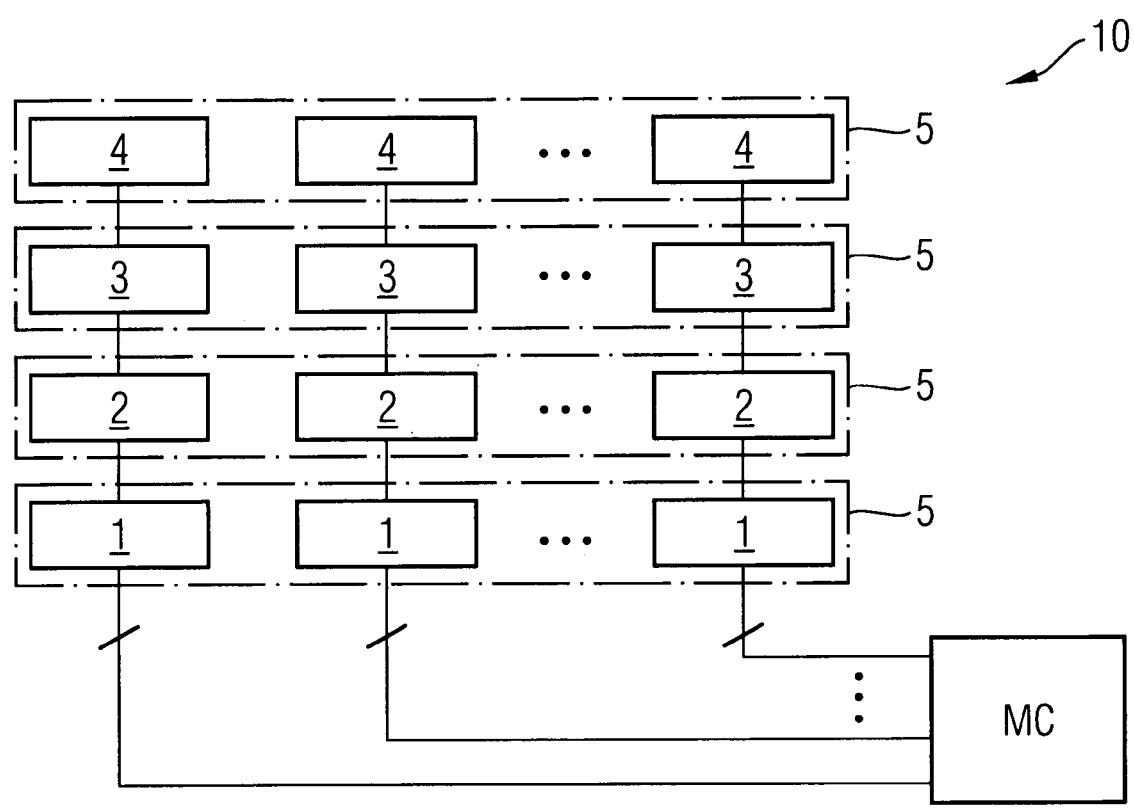
FIG. 3 illustrates diagrammatically a memory system according to one embodiment which has four ranks which in turn are each constructed of several rank parts.

FIG. 3 illustrates diagrammatically another embodiment of a memory system 10. This memory system 10 comprises four ranks 5 which each comprise several rank parts 1-4. A rank 5 can for example comprise four, eight or nine rank parts 1-4. It is also possible for each rank to comprise just one rank part. The rank parts 1-4 arranged above each other in the embodiment illustrated in FIG. 3 are arranged stacked which means they sit above each other in the form of a stack. The memory controller MC controls each stack arrangement of rank parts 1-4 via its own lines so that the memory controller MC is able to control all stack arrangements of rank parts 1-4 in parallel.

FIGS. 4A-4D illustrate embodiments of four different reflection- or rotation-symmetrical geometric arrangements 21-24.

FIG. 4A illustrates one embodiment of a reflection- and rotation-symmetrical geometric arrangement where the connections 11, 12 are arranged in series. In contrast to the embodiment illustrated in FIG. 1, the arrangement of FIG. 4A illustrates not six but seven connections 11 on the input side and connections 12 on the output side. The centre three connections carry the address information of the rank to be addressed, whereas the connections marked with reference numeral 14 carry no address information. The centre connection 15 carries a parity bit, as a bit detecting an error, of the address information.

The geometric arrangement "row" has two reflection- or rotation-symmetrical alignments. If the number of connections is uneven, the centre connection retains its position independently of the reflection- or rotation-symmetrical alignment. Therefore the centre position is predestined for the parity bit as the position of the parity bit is known to the receiving rank part.

FIG. 4B illustrates one embodiment of a rotation-symmetrical (and reflection-symmetrical in relation to the y-axis) geometric arrangement 22 of connections 11, 12 in the form of a triangle. The centre three connections 13 carry the address information of the rank or rank parts. As this is an equilateral triangle, this geometric arrangement 22 has six possible reflection- and/or rotation-symmetrical alignments (three by mere rotation and a further three by reflection with subsequent rotation). In each case, the centre three connections 13 carry the address information irrespective of which of the six reflection- and/or rotation-symmetrical alignments is present.

FIG. 4C illustrates one embodiment of rotation-symmetrical geometric arrangement 23 of connections 11, 12 in the form of a square. Here again the centre four connections 13 carry the address information of the rank. This geometric arrangement 23 has eight possible reflection- and/or rotation-symmetrical alignments (four by mere rotation and a further four by reflection with subsequent rotation), where naturally in each case the centre four connections 13 carry the address information, irrespective of which of the eight possible reflection- and/or rotation-symmetrical alignments is present.

FIG. 4D illustrates one embodiment of a rectangular geometric arrangement 24 of connections 11, 12 where the connections carrying the address information are again marked with the reference numeral 13 and the connections carrying no address information are again marked with reference numeral 14. The reflection- and rotation-symmetrical geometric arrangement 24 illustrated in FIG. 4D has four reflection- and/or rotation-symmetrical alignments. The arrangement 24 illustrated in FIG. 4D has no connection 15 which lies at the same position or does not change in all reflection- and rotation-symmetrical alignments.

In one embodiment, if now two bits detecting or correcting errors are transmitted via connections which have the geometric arrangement 24 depicted in FIG. 4D, then for example this is possible with the connections marked with reference numerals 31-34. If it is assumed that occupation of the connection 31-34 is invariable only in relation to a reflection about the y-axis, then connections 31-34 can transmit two bits correcting or detecting errors. The connections 31, 32 and connection 33, 34 are each given the same occupation by the memory controller MC since the connections 31 and 32 by reflection about the y-axis become the connections 32 and 31 respectively, as is the case with the connections 33 and 34 and connections 34 and 33. Thus occupation of the connections 31-34 carrying the bits detecting or correcting the error is invariable in relation to both alignments which result from reflection about the y-axis. This means that occupation of connections 31-34 is the same in both alignments of the geometric arrangement 24.

In one embodiment, if it is assumed that the occupation of the connections is invariable only in relation to a reflection about the x-axis, then connections 31, 33 and connections 32, 34 are each given the same occupation by the memory controller MC in order to achieve the two bits detecting or correcting errors.

In one embodiment, if, however, it is assumed that occupation of the connections is invariable in relation to both reflection about the x-axis and reflection about the y-axis, then connections 31-34 can only serve to implement one bit detecting error or parity bit.

Naturally, in other embodiments, the bits detecting or correcting errors in the arrangement 24 can also be transmitted by other connections. These connections should be selected such that the quantity of connections which each transmit a bit detecting or correcting error is invariable in relation to the possible reflection- and rotation-symmetrical alignments of the geometric arrangement 24.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of transferring information in electronic modules connected in a series circuit such that a particular number of input connections of one of the electronic modules is connected with the particular number of output connections of another of the electronic modules, the method comprising:
    transferring, at each electronic module, information which each electronic module receives on an input side at an nth of each electronic module's input connections is transferred to an nth of each electronic module's output connections;
    wherein the input connections and the output connections of each electronic module are arranged in a same geometric arrangement;
    receiving, at each electronic module, irrespective of a geometric orientation of the input connections of a given electronic module in relation to a geometric orientation of the output connections of a corresponding electronic module connected with the given electronic module on the input side of the given electronic module, at the same of the given electronic module's input connections, a particular information which is transmitted by the same output connections of the corresponding electronic module; and
    if the particular information comprises n bits detecting or correcting errors, where n is a natural number, transmitting the n bits detecting or correcting errors via n further input connections or output connections of each electronic module which are not subject to rotation or reflection.

2. The method according to claim 1, comprising:
    receiving, at each electronic module, at the same of the given electronic module's input connections the particular information which is transmitted by the same output connections of the corresponding electronic module, irrespective of whether the geometric orientation of the input connections of the given electronic module, in relation to the geometric orientation of the output connections of the corresponding electronic module, is reflected, rotated, reflected and rotated, or neither reflected nor rotated.

3. The method according to claim 1, wherein the particular information is an address of an electronic module.

4. The method according to claim 1, wherein each electronic module is a part of a rank of a digital memory.

5. The method according to claim 1, wherein the geometric arrangement is reflection-symmetrical and/or rotation-symmetrical, and wherein those input connections and output connections of each electronic module that carry the particular information are arranged in a centre area of this arrangement which is invariable in relation to a reflection-symmetrical and/or rotation-symmetrical alignment of the geometric arrangement.

6. The method according to claim 1, comprising:
providing, in an initialization phase, the particular information to each electronic module such that if a particular information unique for one of the electronic modules is applied at the input connections of the first electronic module receiving the particular information, the given electronic module receives the prespecified particular information at the given electronic module's input connections receiving the particular information, wherein rotated and/or reflected connections between the electronic modules are taken into account.

7. The method according to claim 1, comprising:
applying information, which is to be transmitted to one of the electronic modules via the input connections carrying the particular information, to the input connections of the first electronic module carrying the particular information such that any reflected and/or rotated connection of the input connections and output connections of the electronic modules is not taken into account; and
applying information, which is to be transmitted to one of the electronic modules via the input connections not carrying the particular information, to the input connections of the first electronic module not carrying the particular information such that any reflected and/or rotated connection of the input connections and output connections of the electronic modules is taken into account.

8. The method according to claim 1, wherein, if the particular information comprises a parity bit, the method comprises:
transmitting the parity bit via a centre input connection or output connection of each electronic module.

9. The method according to claim 1, wherein, if the particular information comprises n bits detecting or correcting errors, wherein n is a natural number, the method comprises:
transmitting the particular information d times via n particular input connections or output connections of each electronic module, where d is a natural number greater than 1 which specifies how many reflection-symmetrical and/or rotation-symmetrical alignments of the geometric arrangement are taken into account in the connection of two adjacent electronic modules, and wherein the particular information is transmitted via the d×n particular input connections or output connections of each electronic module such that the occupation of the d×n particular input connections or output connections of each electronic module is invariable in relation to the d reflection-symmetrical and/or rotation-symmetrical alignments of the geometric arrangement to be taken into account.

10. A method of transferring an address in electronic modules connected in a series circuit such that a particular number of input connections of one of the electronic modules is connected with the particular number of output connections of another of the electronic modules, the method comprising:
transferring, at each electronic module, information which each electronic module receives on an input side to an output side;
wherein input connections and output connections of each electronic module are arranged in the same geometric arrangement;
receiving, at each electronic module, irrespective of a geometric orientation of the input connections of a given electronic module in relation to a geometric orientation of the output connections of a corresponding electronic module connected with the given electronic module on the input side of the given electronic module, at the same of the given electronic module's input connections, an address which is transmitted by the same output connections of the corresponding electronic module; and
if the address comprises n bits detecting or correcting errors, where n is a natural number, transmitting the n bits detecting or correcting errors via n further input connections or output connections of each electronic module which are not subject to rotation or refection.

11. An electronic assembly comprising:
electronic modules connected in a series circuit such that a particular number of input connections of one of the electronic modules is connected with the particular number of output connections of another of the electronic modules;
wherein each electronic module is configured to pass on an information which each electronic module receives on an input side at an nth of each electronic module's input connections to an nth of each electronic module's output connections;
wherein the input connections and output connections of each electronic module are arranged in a same geometric arrangement;
wherein each electronic module is configured to receive, irrespective of a geometric orientation of the input connections of a given electronic module in relation to a geometric orientation of the output connections of a corresponding electronic module connected with the given electronic module on the input side of the given electronic module, at the same of the given electronic module's input connections, a particular information which is transmitted by the same output connections of the corresponding electronic module;
wherein the geometric arrangement is reflection-symmetrical and/or rotation-symmetrical, and wherein those input connections and output connections of each electronic module which carry the particular information are arranged in a centre area of this arrangement which is invariable in relation to a reflection-symmetrical and/or rotation-symmetrical alignment of the geometric arrangement.

12. The electronic assembly according to claim 11, wherein each electronic module is configured to receive at the same of the given electronic module's input connections the particular information which is transmitted by the same output connections of the corresponding electronic module, irrespective of whether the geometric orientation of the input connections of the given electronic module, in relation to the geometric orientation of the output connections of the corresponding electronic module, is reflected, rotated, reflected and rotated, or neither reflected nor rotated.

13. The electronic assembly according to claim 12, wherein, if the particular information comprises n bits detecting or correcting errors, where n is a natural number, the n bits detecting or correcting errors are transmitted via n further input connections or output connections of each electronic module which are not subject to rotation.

14. The electronic assembly according to claim 11, wherein the particular information is an address of an electronic module.

15. The electronic assembly according to claim 11, wherein each electronic module is a part of a rank of a digital memory.

16. The electronic assembly according to claim 11, comprising:
a control device configured to occupy the input connections of the first electronic module, and in an initialization phase, to specify the particular information for each electronic module such that when the control device applies a particular information unique to one of the electronic modules to the input connections of the first module receiving the particular information, the given electronic module receives the specific particular information at the given electronic module's input connections receiving the particular information, wherein rotated and/or reflected connections between the electronic modules are taken into account, wherein the way in which the connections between the modules are reflected and/or rotated can be specified to the control device.

17. The electronic assembly according to claim 11, wherein the control device is configured to send an individual particular information to one of the electronic modules, by applying the individual particular information to the input connections of the first electronic module carrying the particular information without taking into account any reflected and/or rotated connection of the input connections and output connections of the electronic modules, and by applying an information which is to be transmitted via the input connections not carrying the particular information to one of the electronic modules on the input connections of the first electronic module not carrying the particular information so as to take into account an information that can be specified to the control device with regard to any reflected and/or rotated connection of the input connections and output connections of the electronic modules.

18. The electronic assembly according to claim 11, wherein, if the particular information comprises a parity bit, each electronic module comprises a centre input connection or output connection configured to transmit the parity hit.

19. The electronic assembly according to claim 11, wherein, if the particular information comprises n bits detecting or correcting errors, wherein n is a natural number, the particular information is transmitted d times via n particular input connections or output connections of each electronic module, where d is a natural number greater than 1 which specifies how many reflection-symmetrical and/or rotation-symmetrical alignments of the geometric arrangement are to be taken into account, and wherein the particular information is transmitted via the d×n particular input connections or output connections of each electronic module such that the occupation of the d×n particular input connections or output connections of each electronic module is invariable in relation to the d reflection-symmetrical and/or rotation-symmetrical alignments of the geometric arrangement to be taken into account.

20. The electronic assembly according to claim 11, wherein the electronic modules are substantially identical in construction.

21. The electronic assembly according to claim 11, wherein the electronic assembly is a memory system.

22. An electronic assembly comprising:
electronic modules connected in a series circuit such that a particular number of input connections of one of the electronic modules is connected with the particular number of output connections of another of the electronic modules;
wherein each electronic module is configured to pass on an information which each electronic module receives on an input side to an output side;
wherein the input connections and output connections of each electronic module are arranged in a same geometric arrangement;
wherein each electronic module is configured to receive, irrespective of a geometric orientation of the input connections of a given electronic module in relation to a geometric orientation of the output connections of a corresponding electronic module connected with the given electronic module on the input side of the given electronic module, at the same of the given electronic module's input connections, an address which is transmitted by the same output connections of the corresponding electronic module;
wherein the geometric arrangement is reflection-symmetrical and/or rotation-symmetrical, and wherein those input connections and output connections of each electronic module which carry the particular information arc arranged in a centre area of this arrangement which is invariable in relation to a reflection-symmetrical and/or rotation-symmetrical alignment of the geometric arrangement.

23. An electronic assembly comprising:
electronic modules connected in a series circuit such that a particular number of input connections of one of the electronic modules is connected with the particular number of output connections of another of the electronic modules;
means for transferring, at each electronic module, information which each electronic module receives on an input side at an nth of each electronic module's input connections is transferred to an nth of each electronic module's output connections;
wherein the input connections and the output connections of each electronic module are arranged in a same geometric arrangement; and
means for receiving, at each electronic module, irrespective of a geometric orientation of the input connections of a given electronic module in relation to a geometric orientation of the output connections of a corresponding electronic module connected with the given electronic module on the input side of the given electronic module, at the same of the given electronic module's input connections, a particular information which is transmitted by the same output connections of the corresponding electronic module:
wherein, if the particular information comprises n bits detecting or correcting errors, where n is a natural number, the n bits detecting or correcting errors are transmitted via n further input connections or output connections of each electronic module which are not subject to rotation.

* * * * *